United States Patent
Morikazu

(10) Patent No.: US 9,941,166 B2
(45) Date of Patent: *Apr. 10, 2018

(54) METHOD OF PROCESSING A SUBSTRATE

(71) Applicant: DISCO CORPORATION, Tokyo (JP)

(72) Inventor: Hiroshi Morikazu, Tokyo (JP)

(73) Assignee: DISCO Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/420,285

(22) Filed: Jan. 31, 2017

(65) Prior Publication Data

US 2017/0221763 A1    Aug. 3, 2017

(30) Foreign Application Priority Data

Feb. 1, 2016    (DE) .......................... 10 2016 201 461

(51) Int. Cl.
| | |
|---|---|
| *H01L 21/78* | (2006.01) |
| *H01L 21/304* | (2006.01) |
| *H01L 21/306* | (2006.01) |
| *H01L 21/3065* | (2006.01) |
| *H01L 21/67* | (2006.01) |
| *H01L 23/544* | (2006.01) |

(52) U.S. Cl.
CPC ............ *H01L 21/78* (2013.01); *H01L 21/304* (2013.01); *H01L 21/3065* (2013.01); *H01L 21/30604* (2013.01); *H01L 21/67092* (2013.01); *H01L 23/544* (2013.01); *H01L 2223/54453* (2013.01)

(58) Field of Classification Search
CPC ..... H01L 21/78; H01L 23/544; H01L 21/428; H01L 33/0075; H01L 33/0054; H01L 21/304; H01S 5/0203; H01S 5/021
See application file for complete search history.

(56) References Cited

U.S. PATENT DOCUMENTS

| | | |
|---|---|---|
| 2004/0259329 A1 | 12/2004 | Boyle et al. |
| 2013/0183836 A1 | 7/2013 | Kim et al. |
| 2015/0159821 A1 | 6/2015 | Arakawa |
| 2017/0076983 A1* | 3/2017 | Morikazu ............. H01L 21/304 |

OTHER PUBLICATIONS

Examination report issued in German patent application DE 10 2016 201 461, dated Jul. 27, 2016.

* cited by examiner

*Primary Examiner* — Roy Potter

(74) *Attorney, Agent, or Firm* — Greer Burns & Crain, Ltd.

(57) ABSTRACT

The invention relates to a method of processing a substrate, having a first surface with a device area and a second surface opposite the first surface, wherein the device area has a plurality of devices formed therein. The method comprises applying a pulsed laser beam to the substrate from the side of the second surface, in a plurality of positions along the second surface, so as to form a plurality of hole regions in the substrate, each hole region extending from the second surface towards the first surface. Each hole region is composed of a modified region and a space in the modified region open to the second surface. The method further comprises grinding the second surface of the substrate, where the plurality of hole regions has been formed, to adjust the substrate thickness.

14 Claims, 8 Drawing Sheets

METHOD OF PROCESSING A SUBSTRATE

TECHNICAL FIELD

The present invention relates to a method of processing a substrate, having a first surface with a device area and a second surface opposite the first surface, wherein the device area has a plurality of devices formed therein.

TECHNICAL BACKGROUND

In an optical device fabrication process, an optical device layer, e.g., composed of an n-type nitride semiconductor layer and a p-type nitride semiconductor layer, is formed on the front side of a single crystal substrate, such as a sapphire substrate, a silicon carbide (SiC) substrate or a gallium nitride (GaN) substrate, or on the front side of a glass substrate. The optical device layer is formed in a device area on the front side of the single crystal substrate or the glass substrate.

The optical device layer is partitioned by crossing division lines (also referred to as "streets") to define separate regions where optical devices, such as light emitting diodes (LEDs) and laser diodes, are respectively formed. By providing the optical device layer on the front side of the single crystal substrate or the glass substrate, an optical device wafer is formed. The optical device wafer is separated, e.g., cut, along the division lines to divide the separate regions where the optical devices are formed, thereby obtaining the individual optical devices as chips or dies.

Substantially the same approach as detailed above is also adopted to obtain, for example, individual semiconductor devices, power devices, medical devices, electrical components or MEMS devices from substrates, such as single crystal substrates, glass substrates, compound substrates or polycrystalline substrates, with device areas in which these devices are formed.

The fabrication processes referred to above generally comprise a grinding step for adjusting the substrate thickness. The grinding step is performed from a back side of the substrate which is opposite to a substrate front side on which the device area is formed.

In particular, in order to achieve a size reduction of electronic equipment, the size of devices, such as optical devices, semiconductor devices, power devices, medical devices, electrical components or MEMS devices, has to be reduced. Hence, substrates having the devices formed thereon are ground in the above grinding step to thicknesses in the μm range, e.g., in the range from 30 to 200 μm.

However, in known device fabrication processes, problems may arise in the grinding step, such as damage to the substrate, e.g., by burning the substrate surface, or an unstable and slow grinding process, especially if the substrate is made of a material which is difficult to grind, such as glass, silicon (Si), gallium arsenide (GaAs), gallium nitride (GaN), gallium phosphide (GaP), indium arsenide (InAs), indium phosphide (InP), silicon carbide (SiC), silicon nitride (SiN), lithium tantalate (LT), lithium niobate (LN), sapphire ($Al_2O_3$), aluminium nitride (AlN), silicon oxide ($SiO_2$) or the like.

Further, when substrates made of such difficult-to-process materials are ground, a considerable wear of the grinding means used for grinding occurs, resulting in a reduced service life of the grinding equipment, in particular, a grinding wheel included therein, and thus increased processing costs.

Hence, there remains a need for a method of processing a substrate which allows for the substrate to be processed in an efficient, reliable and cost-efficient manner.

SUMMARY OF THE INVENTION

Accordingly, it is an object of the present invention to provide a method of processing a substrate which allows for the substrate to be processed in an efficient, reliable and cost-efficient manner. This goal is achieved by a substrate processing method with the technical features of claim 1. Preferred embodiments of the invention follow from the dependent claims.

The invention provides a method of processing a substrate, having a first surface with a device area and a second surface opposite the first surface, wherein the device area has a plurality of devices formed therein. The method comprises applying a pulsed laser beam to the substrate from the side of the second surface, in a plurality of positions along the second surface, so as to form a plurality of hole regions in the substrate, each hole region extending from the second surface towards the first surface. Each hole region is composed of a modified region and a space in the modified region open to the second surface. The method further comprises grinding the second surface of the substrate, where the plurality of hole regions has been formed, to adjust the substrate thickness.

The pulsed laser beam is applied to the substrate in a plurality of positions along the second surface, i.e., in a plurality of positions on the second surface.

In the method of the invention, the pulsed laser beam is applied to the substrate in a plurality of positions along the second surface. Hence, the hole regions are formed in the plurality of positions along the second surface.

According to the processing method of the invention, the pulsed laser beam is applied to the substrate from the side of the second surface in a plurality of positions along the second surface, so as to form a plurality of hole regions in the substrate. By forming these hole regions, the strength of the substrate in the areas thereof where the hole regions are formed is reduced.

Hence, grinding the second surface of the substrate, where the plurality of hole regions has been formed, is greatly facilitated. Due to the reduction in substrate strength caused by the formation of the hole regions, the stability and reliability of the grinding process are significantly enhanced, allowing for the resulting substrate thickness to be accurately controlled. Further, the grinding process can be performed more efficiently, in particular, with a higher grinding speed.

Since the strength of the substrate is lowered by the formation of the hole regions, the wear of the grinding means used for grinding the substrate can be significantly reduced, even when substrates made of difficult-to-process materials, such as those listed above, are ground. Therefore, the service life of grinding equipment, in particular, a grinding wheel included therein, is considerably extended, resulting in a reduction of the processing costs.

Moreover, the formation of the plurality of hole regions along the second surface contributes to achieving so-called self-sharpening of the grinding means, such as a grinding wheel. Thus, while performing the step of grinding the second surface of the substrate, the grinding means is conditioned at the same time. In this way, clogging of the grinding means can be reliably avoided. Hence, grinding can be carried out with a higher processing load, further increasing the processing rate.

Further, the formation of the hole regions causes a roughening of the second surface. Due to this increase in surface roughness, the grinding means, such as a grinding wheel, used for grinding the second surface can be dressed during the grinding step. In this way, the grinding load is reduced and the substrate surface is reliably prevented from burning.

Therefore, the processing method of the invention allows for the substrate to be processed in an efficient, reliable and cost-efficient manner.

The pulsed laser beam may have a wavelength which allows transmission of the laser beam through the substrate.

The pulsed laser beam may be applied to the substrate in a plurality of positions along the second surface in such a manner that adjacent ones of the positions do not overlap each other.

The pulsed laser beam may be applied to the substrate in a plurality of positions along the second surface in such a manner that a distance between adjacent ones of the positions, i.e., a distance between centres of adjacent positions, is within a range of 3 μm to 50 μm, preferably 5 μm to 40 μm and more preferably 8 μm to 30 μm. The plurality of hole regions may be formed in the substrate so that a distance between centres of adjacent hole regions is in the range of 3 μm to 50 μm, preferably 5 μm to 40 μm and more preferably 8 μm to 30 μm. Particularly preferably, the distance between centres of adjacent hole regions is in the range of 8 μm to 10 μm. The hole regions may be equidistantly spaced from each other. Alternatively, some or all of adjacent or neighbouring hole regions may have different distances from each other.

The hole regions may be formed with an areal density on the second surface in the range of 400 to 100000 hole regions per $mm^2$, preferably 600 to 50000 hole regions per $mm^2$ and more preferably 1000 to 20000 hole regions per $mm^2$.

The diameters of the hole regions may be substantially constant along the direction from the second surface towards the first surface of the substrate.

The hole regions may have diameters in the range of 1 μm to 30 μm, preferably 2 μm to 20 μm and more preferably 3 μm to 10 μm.

Particularly preferably, the hole regions may have diameters in the range of 2 μm to 3 μm.

The plurality of hole regions is preferably formed in the substrate so that the modified regions of adjacent or neighbouring hole regions do not overlap each other. In this way, it can be particularly reliably ensured that the substrate maintains a sufficient degree of strength or robustness for allowing efficient further handling and/or processing thereof, in particular, in the step of grinding the second surface of the substrate.

Preferably, the distance between outer edges of adjacent or neighbouring hole regions is at least 1 μm.

The plurality of hole regions may be formed in the substrate so that the modified regions of adjacent or neighbouring hole regions at least partially overlap each other. In some embodiments, the modified regions of adjacent or neighbouring hole regions only overlap each other along a part of the extension of the hole regions along the thickness of the substrate. For example, the modified regions of adjacent or neighbouring hole regions may only overlap each other along a part of the extension of the hole regions along the thickness of the substrate which is closer to the second surface of the substrate. The modified regions of adjacent or neighbouring hole regions may be configured so as not to overlap each other along a part of the extension of the hole regions along the thickness of the substrate which is closer to the first surface of the substrate.

The plurality of hole regions may be formed in the substrate so that the spaces of adjacent or neighbouring hole regions at least partially overlap each other. In some embodiments, the spaces of adjacent or neighbouring hole regions only overlap each other along a part of the extension of the hole regions along the thickness of the substrate. For example, the spaces of adjacent or neighbouring hole regions may only overlap each other along a part of the extension of the hole regions along the thickness of the substrate which is closer to the second surface of the substrate. The spaces of adjacent or neighbouring hole regions may be configured so as not to overlap each other along a part of the extension of the hole regions along the thickness of the substrate which is closer to the first surface of the substrate.

Some or all of the hole regions may have a substantially cylindrical shape or a tapered shape.

Some or all of the hole regions may substantially have the shape of a cylinder with the longitudinal cylinder axis arranged along the direction from the second surface towards the first surface of the substrate. In this case, the diameters of the hole regions are substantially constant along the direction from the second surface towards the first surface of the substrate.

Some or all of the hole regions may have a tapered shape, wherein the hole regions taper along their extension along the thickness of the substrate. The hole regions may taper along the direction from the second surface towards the first surface of the substrate. In this case, the diameters of the hole regions decrease in the direction from the second surface towards the first surface of the substrate.

The pulsed laser beam may be applied to the substrate in a condition where a focal point of the pulsed laser beam is located on the second surface or at a distance from the second surface in the direction from the second surface towards the first surface.

The substrate may be made of a material which is transparent to the pulsed laser beam. In this case, the plurality of hole regions are formed in the substrate by the application of a pulsed laser beam having a wavelength that allows transmission of the laser beam through the substrate.

The pulsed laser beam may be applied to the substrate in a condition where a focal point of the pulsed laser beam is located on the second surface or at a distance from the second surface in the direction opposite to the direction from the second surface towards the first surface. In this case, the pulsed laser beam is applied to the substrate in a condition where the focal point of the pulsed laser beam is located on the second surface or at a distance from the second surface in the direction from the second surface away from the first surface.

The plurality of hole regions may be formed in the substrate by the application of a pulsed laser beam having such a wavelength that it is absorbed by the substrate material. In this case, the hole regions are formed by laser ablation. This approach is particularly efficient for processing a silicon carbide (SiC) substrate, such as a SiC wafer.

An aspect ratio of a hole region is defined as the diameter of the hole region divided by the extension of the hole region along the thickness of the substrate, i.e., the length along which the hole region extends in the thickness direction of the substrate. The hole regions may have aspect ratios of 1:5 or less, preferably 1:10 or less and more preferably 1:20 or less. An aspect ratio of approximately 1:5 allows for a particularly simple process set-up to be used. For an aspect ratio of approximately 1:20 or less, the hole regions can be formed in a particularly efficient manner.

The hole regions may have diameters of 17.5 μm or more, preferably 35 μm or more, and more preferably 70 μm or more. In this way, an extension of the hole regions along the thickness of the substrate of 350 μm or more can be efficiently and reliably achieved with the above-identified aspect ratios of the hole regions.

The substrate may be a single crystal substrate or a glass substrate or a compound substrate, such as a compound semiconductor substrate, e.g., a GaAs substrate, or a polycrystalline substrate, such as a ceramic substrate. In particularly preferred embodiments, the substrate is a single crystal substrate or a glass substrate.

The modified region is a region of the substrate which has been modified by the application of the pulsed laser beam. For example, the modified region may be a region of the substrate in which the structure of the substrate material has been modified by the application of the pulsed laser beam.

The modified region may be an amorphous region or a region in which cracks are formed. In particularly preferred embodiments, the modified region is an amorphous region.

If the modified region is a region in which cracks are formed, i.e., cracks have been formed, the cracks may be microcracks. The cracks may have dimensions, e.g., lengths and/or widths, in the μm range. For example, the cracks may have widths in the range of 5 μm to 100 μm and/or lengths in the range of 100 μm to 1000 μm.

In some embodiments of the method of the present invention, the substrate is a single crystal substrate, and the method comprises applying a pulsed laser beam to the single crystal substrate from the side of the second surface, in a plurality of positions along the second surface, so as to form a plurality of hole regions in the single crystal substrate, each hole region extending from the second surface towards the first surface, wherein each hole region is composed of an amorphous region and a space in the amorphous region open to the second surface, and grinding the second surface of the single crystal substrate, where the plurality of hole regions has been formed, to adjust the substrate thickness. The amorphous regions render the substrate more fragile in the area where the plurality of hole regions has been formed, thus further facilitating the grinding process. The pulsed laser beam may be applied to the single crystal substrate in a condition where a focal point of the pulsed laser beam is located on the second surface or at a distance from the second surface in the direction from the second surface towards the first surface.

In some embodiments of the method of the present invention, the substrate is a compound substrate or a polycrystalline substrate, and the method comprises applying a pulsed laser beam to the substrate from the side of the second surface, in a plurality of positions along the second surface, so as to form a plurality of hole regions in the substrate, each hole region extending from the second surface towards the first surface, wherein each hole region is composed of an amorphous region and a space in the amorphous region open to the second surface, and grinding the second surface of the substrate, where the plurality of hole regions has been formed, to adjust the substrate thickness. The amorphous regions render the substrate more fragile in the area where the plurality of hole regions has been formed, thus further facilitating the grinding process.

In some embodiments of the method of the present invention, the substrate is a glass substrate, and the method comprises applying a pulsed laser beam to the glass substrate from the side of the second surface, in a plurality of positions along the second surface, so as to form a plurality of hole regions in the glass substrate, each hole region extending from the second surface towards the first surface, wherein each hole region is composed of a region in which cracks are formed and a space in this region open to the second surface, and grinding the second surface of the glass substrate, where the plurality of hole regions has been formed, to adjust the substrate thickness. The cracks render the substrate more fragile in the area where the plurality of hole regions has been formed, thus further facilitating the grinding process. The cracks may be microcracks.

Some or all of the hole regions may be formed so as to extend along only a part of the thickness, in the direction from the second surface towards the first surface, of the substrate. In this case, the spaces in the modified regions of the hole regions open to the second surface but not the first surface of the substrate. Some or all of the hole regions may be formed so as to extend along 30% or more, preferably 40% or more, more preferably 50% or more, even more preferably 60% or more and yet even more preferably 70% or more of the thickness of the substrate.

Particularly preferably, the extension of the hole regions along the thickness of the substrate is chosen such that it is the same as the depth to which substrate material is to be removed in the grinding step or in a sequence of the grinding step and a subsequent stress relief step, such as a polishing and/or an etching step.

By choosing the extension of the hole regions in this way, it can be ensured that the entire portion of the substrate to be ground in the grinding step or to be removed in the sequence of grinding step and subsequent stress relief step has been reduced in strength by the formation of the hole regions. Thus, the grinding process or the sequence of grinding process and subsequent stress relief process can be carried out with a particularly high degree of efficiency and reliability.

Further, the portion of the substrate in which the hole regions were formed is fully removed in the grinding step or the sequence of grinding step and subsequent stress relief step, so that no hole regions remain in the substrate after grinding or after grinding and stress relief.

By forming the hole regions so as to extend along only a part of the thickness of the substrate, any damage to the devices formed in the device area by the pulsed laser beam can be reliably avoided.

The amount of extension of the hole regions along the thickness of the substrate can be accurately controlled, for example, by locating the focal point of the pulsed laser beam at an appropriate distance from the second surface in the direction from the second surface towards the first surface or at an appropriate distance from the second surface in the direction opposite to the direction from the second surface towards the first surface.

The second surface may be ground along the entire extension, in the direction from the second surface towards the first surface, of the hole regions. In this case, the entire portion of the substrate to be ground in the grinding step has been reduced in strength by the formation of the hole regions. Hence, the grinding process can be carried out with a particularly high degree of efficiency and reliability.

Further, the portion of the substrate in which the hole regions were formed is fully removed in the grinding step, so that no hole regions remain in the substrate after grinding.

The hole regions may be formed over the entire second surface. In this way, the strength of the substrate can be lowered in a particularly reliable and efficient way, thus further facilitating the grinding process.

Alternatively, the hole regions may be formed over only a part of the second surface.

In particular, a plurality of division lines may be present on the first surface, the division lines partitioning the plurality of devices, and the hole regions may be formed only in areas of the second surface which are substantially opposite the division lines. Herein, the term "substantially" defines that the areas of the second surface which are opposite the division lines and in which the hole regions are formed may have the same widths as the division lines or widths deviating from the widths of the division lines by up to ±100 μm.

The division lines formed on the first surface of the substrate may have a width in a direction substantially perpendicular to the extension direction thereof in the range of 30 μm to 200 μm, preferably 30 μm to 150 μm and more preferably 30 μm to 120 μm.

By forming the hole regions only in the areas of the second surface which are substantially opposite the division lines, it can be reliably ensured that the devices formed in the device area are not damaged by the pulsed laser beam applied to the substrate.

In particular, some or all of the hole regions may be formed so as to extend along the entire thickness of the substrate, without any risk of damage to the devices by the pulsed laser beam. In this case, the spaces in the modified regions of the respective hole regions open to the second surface and the first surface of the substrate.

By forming the hole regions so as to extend along the entire thickness of the substrate, a step of cutting the substrate along the division lines is facilitated. Specifically, the presence of the hole regions at the division lines reduces the strength of the substrate in the substrate portions to be cut, so that the substrate can be cut in a particularly efficient and reliable manner.

The substrate may be cut, for example, by using a mechanical cutting means, such as a blade or a saw, by laser cutting, by plasma cutting, e.g., using a plasma source, etc. Further, also a combination of these approaches may be used.

If the hole regions are formed so as to extend along the entire thickness of the substrate, for example, mechanical cutting of the substrate along the division lines can be performed in a more efficient manner, in particular, with an increased processing speed. For instance, for the case of a blade or saw dicing process, the blade or saw dicing speed can be significantly increased.

If hole regions remain on the separated parts of the substrate after the cutting process, they may be subsequently removed, e.g., by polishing or etching the outer or side surfaces of the resulting substrate parts, e.g., chips or dies.

Grinding the second surface of the substrate may be performed before cutting the substrate along the division lines.

Grinding the second surface of the substrate may be performed after cutting the substrate along the division lines. In particular, the substrate may be cut along the division lines after the step of forming the hole regions but before the grinding step or before the step of forming the hole regions and the grinding step. In this case, preferably, the cutting step is performed after the hole region forming step but before the grinding step.

In particular, in the step of cutting the substrate along the division lines, the substrate may be cut along only a part of the thickness thereof. Subsequently, grinding of the second surface of the substrate may be performed after the cutting step.

The grinding may be carried out in such a way as to reduce the substrate thickness to a thickness that corresponds to the depth at which the substrate has been cut along the division lines, i.e., to the cutting depth of the cutting step. In this case, the substrate material which had not been reached by the cutting process along the division lines is removed in the grinding step, so that the substrate is divided along the division lines by the grinding process.

Grinding of the second surface of the substrate may thus be performed along a remaining part of the thickness of the substrate, in which no substrate material has been removed in the cutting step, so as to divide the substrate along the division lines.

By dividing the substrate in the grinding step in the manner detailed above, the substrate can be processed in a particularly reliable, accurate and efficient manner.

Specifically, the step of cutting the substrate along the division lines is performed on the substrate before grinding, i.e., before a reduction in thickness thereof. Hence, any deformation of the substrate during cutting along the division lines, such as substrate warpage or the like, can be reliably avoided. Further, the stress applied to the substrate during cutting is significantly reduced, allowing for chips or dies with an increased die strength to be obtained. Any damage to the resulting chips or dies, such as the formation of cracks or back side chipping, can be prevented.

Moreover, since the substrate is cut along the division lines only along a part of the substrate thickness, the efficiency, in particular, the processing speed, of the cutting process is enhanced. Also, the service life of a cutting means used for the cutting step is extended.

The pulsed laser beam may be applied to the substrate in a plurality of positions in the areas of the second surface which are substantially opposite the division lines in such a manner that a distance between adjacent ones of the positions, i.e., a distance between centres of adjacent positions, is within a range of 3 μm to 50 μm, preferably 5 μm to 40 μm and more preferably 8 μm to 30 μm. The plurality of hole regions may be formed in the areas of the second surface which are substantially opposite the division lines so that a distance between centres of adjacent hole regions is in the range of 3 μm to 50 μm, preferably 5 μm to 40 μm and more preferably 8 μm to 30 μm. Particularly preferably, the distance between centres of adjacent hole regions is in the range of 8 μm to 10 μm.

The hole regions may be equidistantly spaced from each other. Alternatively, some or all of adjacent or neighbouring hole regions may have different distances from each other.

The hole regions may be formed with an areal density in the areas of the second surface which are substantially opposite the division lines in the range of 400 to 100000 hole regions per $mm^2$, preferably 600 to 50000 hole regions per $mm^2$ and more preferably 1000 to 20000 hole regions per $mm^2$.

At least one beam blocking layer may be present on the first surface, wherein the at least one beam blocking layer is arranged below the devices in the direction from the first surface towards the second surface and the at least one beam blocking layer is opaque to the pulsed laser beam.

By providing at least one such beam blocking layer on the first surface, it can be reliably ensured that any damage to the devices formed in the device area by the pulsed laser beam is reliably avoided.

The at least one beam blocking layer may be configured to block the pulsed laser beam, for example, by absorbing or reflecting the pulsed laser beam.

The at least one beam blocking layer may be, for example, a metal layer or a high reflection coating, such as a metal high reflection coating or a dielectric multilayer high reflection coating.

The at least one beam blocking layer may extend at least over the entire device area. In this way, any damage to the devices formed in the device area by the pulsed laser beam can be avoided in a particularly simple and reliable manner.

A plurality of separate beam blocking layers may be present on the first surface, wherein each beam blocking layer is arranged below a respective device in the direction from the first surface towards the second surface. In this way, the amount of material required for forming the beam blocking layer or layers can be significantly reduced.

The method of the invention may further comprise polishing the second surface after grinding the second surface. By polishing the second surface after the grinding step, any stress generated in the substrate during grinding can be relieved. The polishing step may be, for example, a dry polishing step, a wet polishing step, a chemical mechanical polishing (CMP) step or a lapping step.

The method of the invention may further comprise etching the second surface after grinding the second surface. By etching the second surface after the grinding step, any stress generated in the substrate during grinding can be relieved. The etching step may be a dry etching step, such as a plasma etching step, or a wet etching step.

Further, also a combination of polishing and etching may be applied to the second surface of the substrate after grinding thereof.

The substrate may be made of a material which is transparent to the pulsed laser beam. In this case, the plurality of hole regions are formed in the substrate by the application of a pulsed laser beam having a wavelength that allows transmission of the laser beam through the substrate.

Alternatively, the plurality of hole regions may be formed in the substrate by the application of a pulsed laser beam having such a wavelength that it is absorbed by the substrate material. In this case, the hole regions are formed by laser ablation.

For example, if the substrate is a silicon (Si) substrate, the pulsed laser beam may have a wavelength of 1.5 µm or more.

The pulsed laser beam may have a pulse width, for example, in the range of 0.5 ps to 20 ps.

The substrate may be, for example, a semiconductor substrate, a sapphire ($Al_2O_3$) substrate, a ceramic substrate, such as an alumina ceramic substrate, a quartz substrate, a zirconia substrate, a PZT (lead zirconate titanate) substrate, a polycarbonate substrate, an optical crystal material substrate or the like. The substrate may be a wafer made of one or more of the materials listed above.

In particular, the substrate may be, for example, a silicon (Si) substrate, a gallium arsenide (GaAs) substrate, a gallium nitride (GaN) substrate, a gallium phosphide (GaP) substrate, an indium arsenide (InAs) substrate, an indium phosphide (InP) substrate, a silicon carbide (SiC) substrate, a silicon nitride (SiN) substrate, a lithium tantalate (LT) substrate, a lithium niobate (LN) substrate, a sapphire ($Al_2O_3$) substrate, an aluminium nitride (AlN) substrate, a silicon oxide ($SiO_2$) substrate or the like. The substrate may be a wafer made of one or more of the materials listed above.

The substrate may be a glass substrate, such as for example a glass wafer.

The substrate may be made of a single material or of a combination of different materials, e.g., two or more of the above-identified materials.

There are no limitations regarding the shapes and sizes of the substrates which may be processed using the method of the present invention.

For example, the substrate may have, in a top view thereof, a circular or annular shape, an elliptic shape, a rectangular shape, a square shape, the shape of a segment of a circle, such as a semi-circle or a quadrant, or the like.

For the case of a circular or annular substrate, the substrate may have a diameter, for example, in the range from approximately 5.1 cm to approximately 30.5 cm (2 inches to 12 inches). For the case of a square substrate, the substrate may have a size, for example, in the range from 50×50 $mm^2$ to 300×300 $mm^2$.

The thickness of the substrate before grinding may be, for example, in the range from 200 µm to 1500 µm, preferably in the range from 700 µm to 1000 µm. The thickness of the substrate after grinding may be, for example, in the range from 30 µm to 200 µm.

The devices formed in the device area on the first surface of the substrate may be, for example, optical devices, semiconductor devices, power devices, medical devices, electrical components, MEMS devices or combinations thereof.

The pulsed laser beam may be focused using a focusing lens. A numerical aperture (NA) of the focusing lens may be set so that the value obtained by dividing the numerical aperture of the focusing lens by the refractive index (n) of the substrate is in the range of 0.05 to 0.2. In this way, the hole regions can be formed in a particularly reliable and efficient manner.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods of processing an optical device wafer as a substrate.

The optical device wafer may have a thickness before grinding in the μm range, preferably in the range of 200 μm to 1500 μm and more preferably in the range of 700 μm to 1000 μm.

Figure 1:
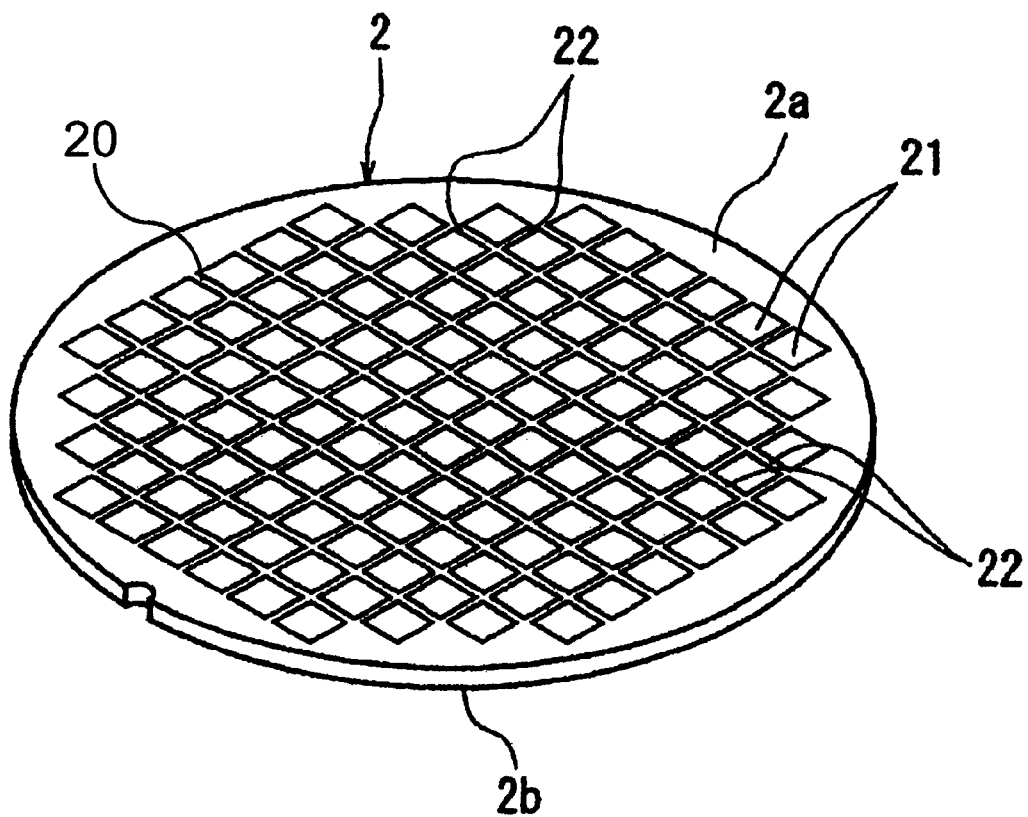
FIG. 1 is a perspective view showing an optical device wafer as a substrate to be processed by the method of the invention.
Figure 2:
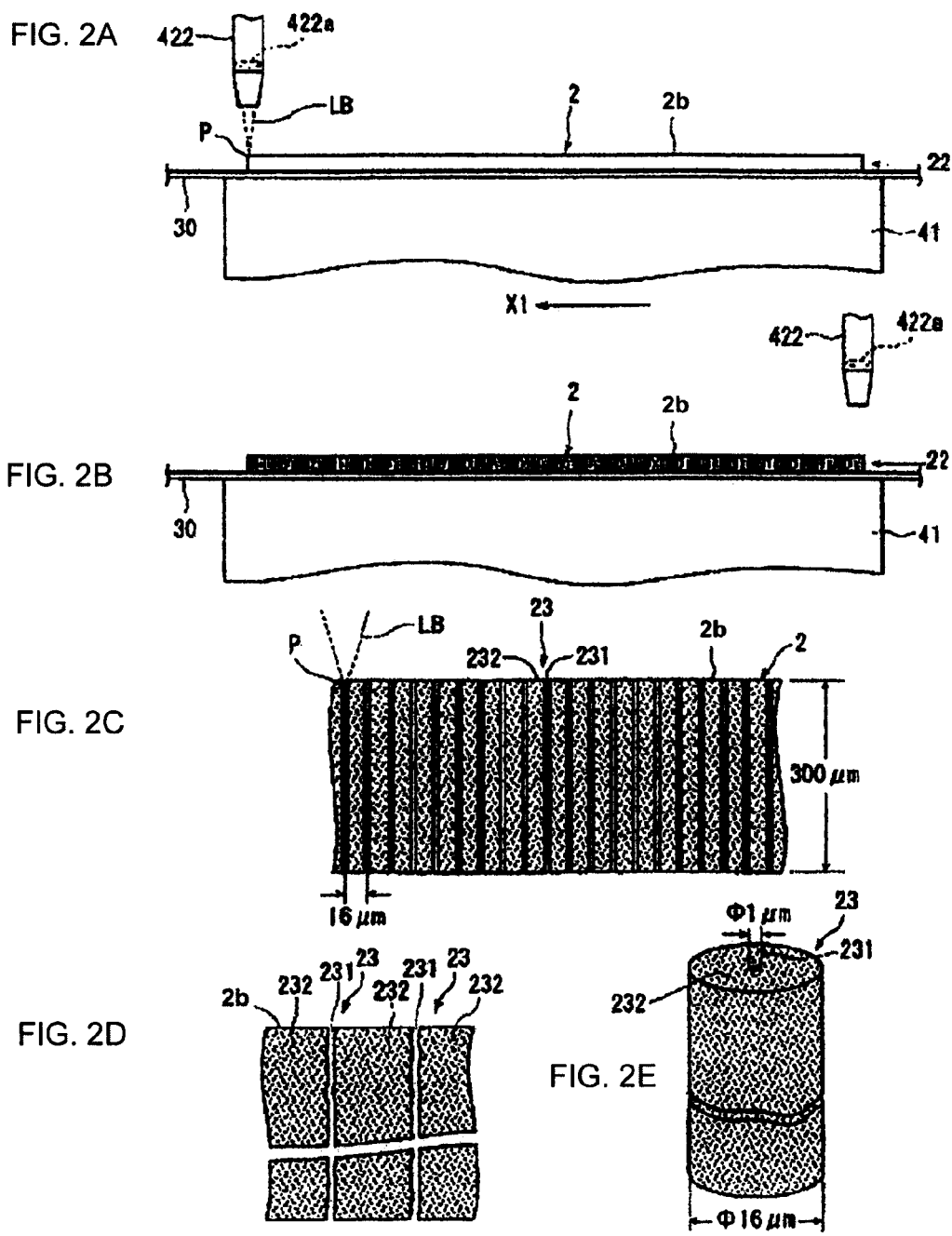
FIGS. 2A to 2E are views for illustrating a step of forming a plurality of hole regions in the optical device wafer of FIG. 1 according to an embodiment of the method of the present invention.

FIG. 1 is a perspective view of an optical device wafer 2 as a substrate to be processed by the processing method of the present invention. The optical device wafer 2 is a single crystal substrate.

In other embodiments, the substrate to be processed by the processing method of the present invention may be a glass substrate or a compound substrate, such as a compound semiconductor substrate, e.g., a GaAs substrate, or a polycrystalline substrate, such as a ceramic substrate.

The optical device wafer 2 shown in FIG. 1 is substantially composed of a sapphire substrate with a thickness of, for example, 400 μm. A plurality of optical devices 21, such as light emitting diodes (LEDs) and laser diodes, is formed in a device area 20 on a front side 2a, i.e., a first surface, of the sapphire substrate. The optical devices 21 are provided on the front side 2a of the sapphire substrate in a grid or matrix arrangement. The optical devices 21 are separated by a plurality of crossing division lines 22 formed on the front side 2a of the sapphire substrate, i.e., on the front side 2a of the optical device wafer 2.

Further, the optical device wafer 2 has a back side 2b, i.e., a second surface, which is opposite the front side 2a.

In the following, an embodiment of the method of the present invention for processing the optical device wafer 2 as the substrate will be described with reference to FIGS. 2A to 4C.

First, a wafer supporting step is performed in such a manner that the optical device wafer 2 is attached to an adhesive tape which may be supported by an annular frame (not shown). Specifically, as is shown in FIG. 2A, the front side 2a of the optical device wafer 2 is attached to an adhesive tape 30. Accordingly, the back side 2b, i.e., the second surface, of the optical device wafer 2 attached to the adhesive tape 30 is oriented upwards, as is shown in FIG. 2A.

FIG. 2A further shows a part of a laser processing apparatus for performing laser processing along the back side 2b of the optical device wafer 2 after carrying out the wafer supporting step described above. The laser processing apparatus includes a chuck table 41 for holding a workpiece, in particular, the optical device wafer 2, a laser beam applying means (not shown) for applying a laser beam to the workpiece held on the chuck table 41, and an imaging means (not shown) for imaging the workpiece held on the chuck table 41. The chuck table 41 has an upper surface as a holding surface for holding the workpiece thereon under suction. The chuck table 41 is movable by a feeding means (not shown) in a feeding direction which is indicated in FIG. 2A by an arrow X1. Further, the chuck table 41 is movable by an indexing means (not shown) in an indexing direction which is orthogonal to the feeding direction X1.

The laser beam applying means includes a cylindrical casing (not shown) extending in a substantially horizontal direction. The casing contains a pulsed laser beam oscillating means (not shown) including a pulsed laser oscillator and a repetition frequency setting means. Further, the laser beam applying means includes a focusing means 422 (see FIG. 2A) mounted on a front end of the casing. The focusing means 422 comprises a focusing lens 422a for focusing a pulsed laser beam oscillated by the pulsed laser beam oscillating means.

The numerical aperture (NA) of the focusing lens 422a of the focusing means 422 is set so that the value obtained by dividing the numerical aperture of the focusing lens 422a by the refractive index (n) of the substrate, i.e., the optical device wafer 2, is within the range of 0.05 to 0.2.

The laser beam applying means further includes a focal position adjusting means (not shown) for adjusting the focal position of the pulsed laser beam to be focused by the focusing lens 422a of the focusing means 422.

The imaging means is mounted on a front end portion of the casing of the laser beam applying means. The imaging means includes an ordinary imaging device (not shown), such as a CCD, for imaging the workpiece by using visible light, an infrared light applying means (not shown) for applying infrared light to the workpiece, an optical system (not shown) for capturing the infrared light applied to the workpiece by the infrared light applying means, and an infrared imaging device (not shown), such as an infrared CCD, for outputting an electrical signal corresponding to the infrared light captured by the optical system. An image signal output from the imaging means is transmitted to a control means (not shown).

When performing laser processing along the back side 2b of the optical device wafer 2 by using the laser processing apparatus, a positioning step is performed in such a manner that the focusing lens 422a of the focusing means 422 and the substrate, i.e., the optical device wafer 2, are positioned relative to each other in the direction along the optical axis of the focusing lens 422a so that the focal point of the pulsed laser beam is located at a desired position in the direction along the thickness of the optical device wafer 2, i.e., at a desired distance from the back side 2b, i.e., the second surface, in the direction from the back side 2b towards the front side 2a, i.e., the first surface.

In other embodiments, the focal point of the pulsed laser beam may be located on the back side 2b or at a desired distance from the back side 2b in the direction opposite to the direction from the back side 2b towards the front side 2a.

When performing the processing method according to the current embodiment of the present invention, the optical device wafer 2 attached to the adhesive tape 30 is first placed on the chuck table 41 of the laser processing apparatus in the condition where the adhesive tape 30 is in contact with the upper surface of the chuck table 41 (see FIG. 2A). Subsequently, a suction means (not shown) is operated to hold the optical device wafer 2 through the adhesive tape 30 on the chuck table 41 under suction (wafer holding step). Accordingly, the back side 2b of the optical device wafer 2 held on the chuck table 41 is oriented upward. Although no annular frame supporting the adhesive tape 30 is shown in FIG. 2A, such a frame may be present and be held by a frame holding means, such as clamps or the like, provided on the chuck table 41. Subsequently, the chuck table 41 holding the optical device wafer 2 under suction may be moved to a position directly below the imaging means by operating the feeding and indexing means.

In the condition where the chuck table 41 is positioned directly below the imaging means, an alignment operation may be performed by the imaging means and the control means in order to detect a subject area of the optical device wafer 2 to be laser processed. Specifically, the imaging means and the control means may perform image processing, such as pattern matching. In this way, alignment of a laser beam applying position is performed (alignment step).

After performing the alignment step detailed above, the chuck table 41 is moved to a laser beam applying area where the focusing means 422 of the laser beam applying means is located, as is shown in FIG. 2A. One end (the left end in FIG. 2A) of the back side 2b is positioned directly below the focusing means 422. Further, the focal position adjusting means (not shown) is operated so as to move the focusing means 422 in the direction along the optical axis of the focusing lens 422a so that the focal point P of a pulsed laser beam LB to be focused by the focusing lens 422 is located at a desired distance from the back side 2b of the optical device wafer 2 in the direction from the back side 2b towards the front side 2a thereof, i.e., in the thickness direction of the optical device wafer 2 (positioning step).

While the alignment step detailed above is required for the processing methods according to the embodiments illustrated in FIGS. 6A-7B, no alignment is necessary for the embodiments shown in FIGS. 4A-5B. In these latter cases, the chuck table 41 holding the optical device wafer 2 under suction may be moved directly to the laser beam applying area without performing an alignment operation.

In the current embodiment, the focal point P of the pulsed laser beam LB is located inside the optical device wafer 2 at a position closer to the back side 2b, i.e., the upwards facing surface, of the optical device wafer 2 to which the pulsed laser beam LB is applied. For example, the focal point P may be located at a distance from the back side 2b in the range of 5 μm to 10 μm.

After performing the positioning step described above, a hole region forming step is performed in such a manner that the laser beam applying means is operated to apply the pulsed laser beam LB from the focusing means 422 to the optical device wafer 2, thereby forming a hole region extending from the back side 2b of the optical device wafer 2, in the vicinity of which the focal point P of the pulsed laser beam LB is located, towards the front side 2a of the optical device wafer 2. The hole region is composed of a modified region, i.e., an amorphous region, and a space in the amorphous region which is open to the back side 2b but not to the front side 2a of the optical device wafer 2 (see FIG. 4B). In particular, as is indicated in FIG. 2C, the hole regions are formed so as to extend along only a part of the thickness, in the direction from the back side 2b towards the front side 2a, of the optical device wafer 2, namely along a distance within the optical device wafer 2 of 300 μm in this exemplary embodiment.

The amount of extension of the hole regions along the thickness of the optical device wafer 2 is controlled by locating the focal point P of the pulsed laser beam LB at an appropriate distance from the back side 2b in the direction from the back side 2b towards the front side 2a.

The pulsed laser beam LB, which has a wavelength that allows transmission of the laser beam LB through the sapphire substrate constituting the optical device wafer 2, is applied to the optical device wafer 2 by the focusing means 422, and the chuck table 41 is moved at a predetermined feed speed in the feeding direction X1 shown in FIG. 2A (hole region forming step). When the other end (right end in FIG. 2B) of the back side 2b reaches the position directly below the focusing means 422, as is shown in FIG. 2B, the application of the pulsed laser beam LB is stopped and the movement of the chuck table 41 is also stopped.

Figure 4A:
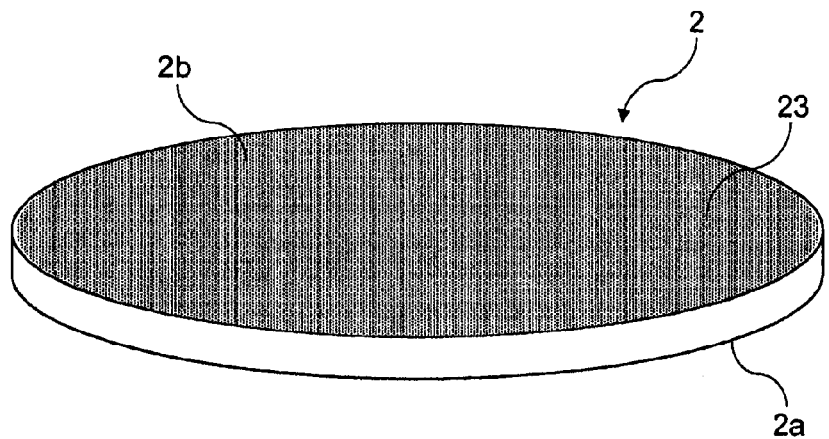
FIG. 4A is a perspective view showing the wafer with the hole regions formed therein, according to the embodiment of the present invention shown in FIG. 2.
Figure 4B:
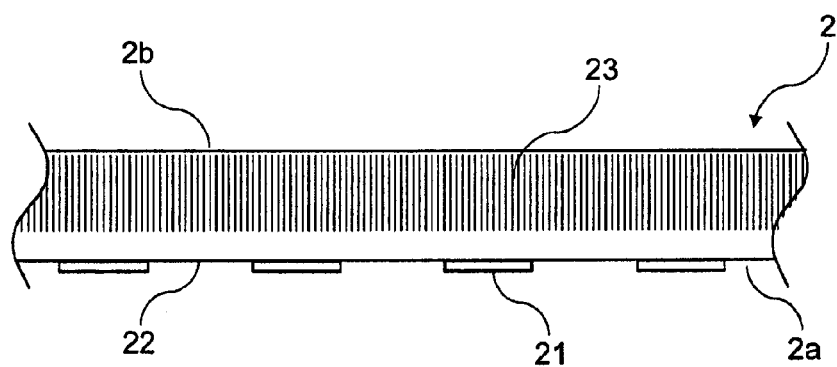
FIG. 4B is a cross-sectional view showing the wafer with the hole regions formed therein.

By performing the hole region forming step detailed above along the back side 2b, a plurality of hole regions 23 is formed in the optical device wafer 2 in a plurality of positions along a first extension direction of the back side 2b, each hole region 23 being composed of a modified region, i.e., an amorphous region 232, and a space 231 in the amorphous region 232 open to the back side 2b but not to the front side 2a of the optical device wafer 2, as is shown in FIG. 4B. The hole regions 23 may be formed along the back side 2b at predetermined, equidistant intervals, as is shown in FIG. 2C. For example, the distance between adjacent hole regions 23 in the first extension direction of the back side 2b may be in the range of 8 μm to 30 μm, e.g., approximately 16 μm (=(work feed speed: 800 mm/second)/(repetition frequency: 50 kHz)).

As is shown in FIGS. 2D and 2E, each hole region 23 is composed of the space 231 having a diameter of approximately 1 μm and the amorphous region 232 which is formed around the space 231 and has an outer diameter of approximately 16 μm. In the current embodiment, the amorphous regions 232 of adjacent hole regions 23 are formed so as not to overlap each other, although this is not shown in the drawings. Specifically, the distance between adjacent hole regions 23 is chosen so as to be slightly larger than the outer diameter of the amorphous regions 232. The amorphous regions of adjacent or neighbouring hole regions 23 are thus disconnected from each other.

In other embodiments, the substrate may be, for example, a glass substrate and the modified regions may be regions in which cracks are formed in the glass substrate. The cracks formed in the glass substrate may be microcracks.

Each hole region 23 formed in the hole region forming step detailed above extends from the back side 2b of the optical device wafer 2 towards the front side 2a thereof. Even when the thickness of the optical device wafer 2 is large, it is sufficient to apply the pulsed laser beam LB once for the formation of each hole region 23, so that the productivity can be greatly enhanced. Furthermore, no debris is scattered in the hole region forming step, so that a degradation of the quality of the resulting devices can be reliably prevented.

The hole region forming step detailed above is performed plural times along the first extension direction of the back side 2b, while shifting the optical device wafer 2 relative to the laser beam applying means in the indexing direction orthogonal to the feeding direction X1, so as to apply the pulsed laser beam LB also in a plurality of positions along a second extension direction of the back side 2b which is orthogonal to the first extension direction thereof. Specifically, the hole regions 23 are formed over the entire back side 2b, as is shown in FIG. 4A. The hole regions 23 may be arranged with identical or different distances between adjacent hole regions 23 in the first extension direction and/or the second extension direction of the back side 2b.

For example, when performing the hole region forming step along the first extension direction of the back side 2b, the pulsed laser beam LB may be split or scanned along the indexing direction orthogonal to the feeding direction X1. In this way, a wider area of the back side 2b can be covered, i.e., formed with hole regions 23, in one pass of the pulsed laser beam LB, so that fewer indexing steps, i.e., steps of shifting the optical device wafer 2 relative to the laser beam applying means in the indexing direction, are necessary in order to form the hole regions 23 over the entire back side 2b. Thus, the processing efficiency can be further enhanced.

Figure 3:
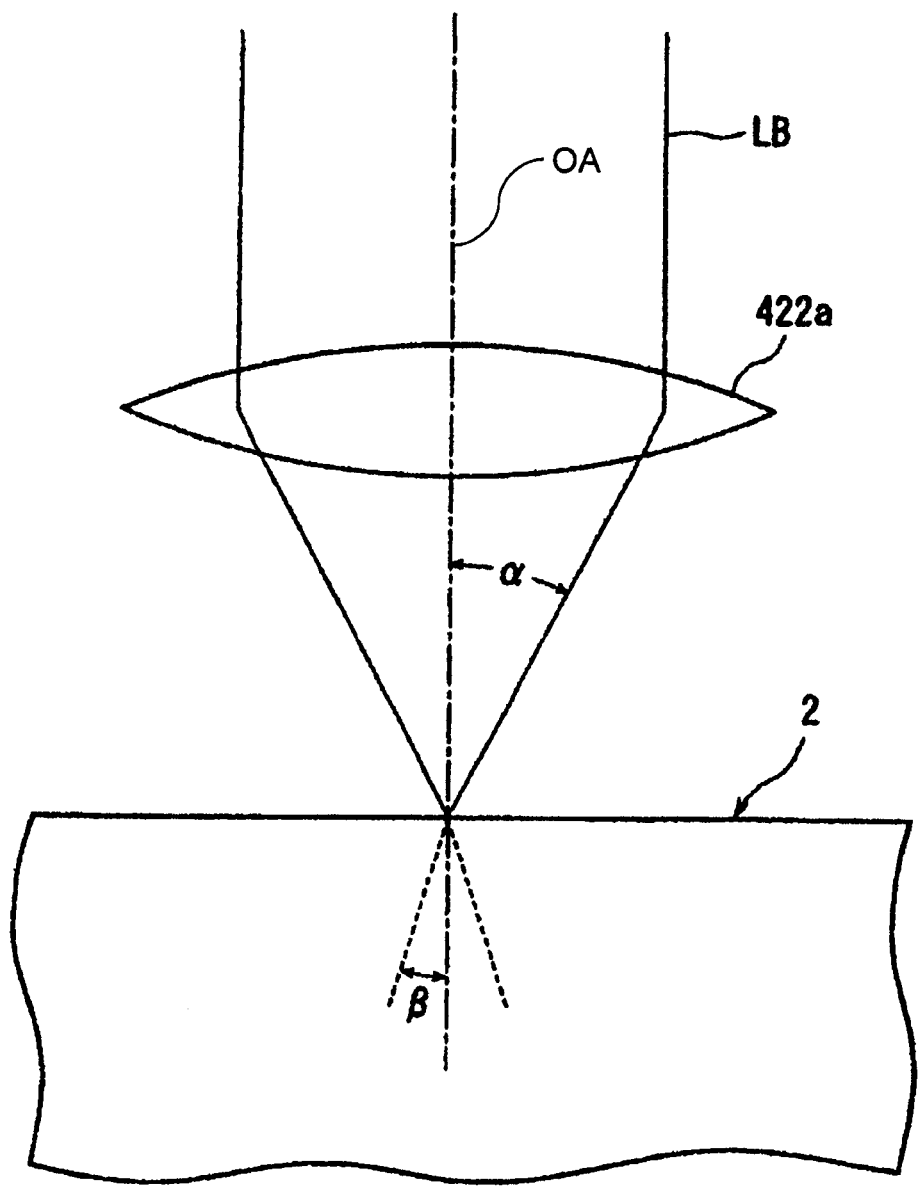
FIG. 3 is a diagram showing the relation between the numerical aperture (NA) of a focusing lens, the refractive index (n) of the optical device wafer, and the value (S=NA/n) obtained by dividing the numerical aperture by the refractive index.

In the following, the relation between the numerical aperture (NA) of the focusing lens 422a, the refractive index (n) of the optical device wafer 2 and the value (S=NA/n) obtained by dividing the numerical aperture by the refractive index will be discussed with reference to FIG. 3. As is shown in FIG. 3, the pulsed laser beam LB entering the focusing lens 422a is focused at an angle $\alpha$ with respect to the optical axis OA of the focusing lens 422a. The numerical aperture of the focusing lens 422a is expressed as sin $\alpha$ (i.e., NA=sin $\alpha$). When the pulsed laser beam LB focused by the focusing lens 422a is applied to the optical device wafer 2 as the substrate, the pulsed laser beam LB is refracted at an angle $\beta$ with respect to the optical axis OA, since the density of the optical device wafer 2 is higher than that of air. This angle $\beta$ with respect to the optical axis OA differs from the angle $\alpha$ according to the refractive index of the optical device wafer 2. Since the refractive index is expressed as N=sin $\alpha$/sin $\beta$, the value (S=NA/n) obtained by dividing the numerical aperture by the refractive index of the optical device wafer 2 is given by sin $\beta$. It was found that setting sin $\beta$ in the range of 0.05 to 0.2 allows for the hole regions 23 to be formed in a particularly efficient and reliable manner.

The hole region forming step may be performed using a pulsed laser beam with a wavelength in the range of 300 nm to 3000 nm, a pulse width of 0.5 ps to 20 ps, an average power of 0.2 W to 10.0 W and a repetition frequency of 10 kHZ to 80 kHZ. The work feed speed with which the optical device wafer 2 is moved relative to the laser beam applying means in the hole region forming step may be in the range of 500 mm/second to 1000 mm/second.

If a semiconductor substrate is used as the substrate, e.g., the single crystal substrate, to be processed by the method of the present invention, a hole region 23 can be formed in a particularly efficient and reliable manner if the wavelength of the pulsed laser beam LB is set to a value which is two or more times the wavelength (reduced wavelength) corresponding to the band gap of the semiconductor substrate.

Figure 4C:
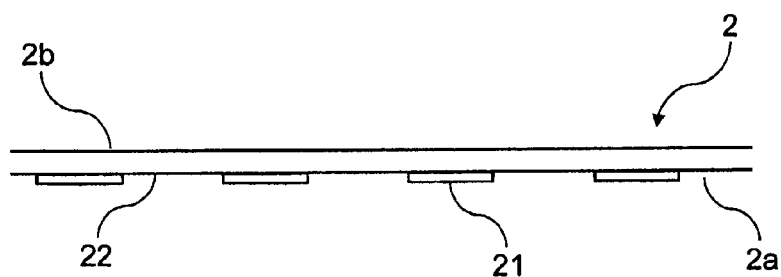
FIG. 4C is a cross-sectional view showing the wafer after the grinding step.

After performing the hole region forming step in the manner detailed above, a step of grinding the back side 2b of the optical device wafer 2 is carried out, the outcome of which is shown in FIG. 4C. Specifically, the back side 2b is ground along the entire extension, in the direction from the back side 2b towards the front side 2a, of the hole regions 23. Hence, the portion of the optical device wafer 2 in which the hole regions 23 were formed is fully removed in the grinding step, as is shown in FIG. 4C.

The step of grinding the back side 2b of the optical device wafer 2 may be carried out using a grinding apparatus, as will be described in detail further below with reference to FIG. 8.

The optical device wafer 2 shown in FIG. 4C has been ground to the desired thickness of the chips or dies to be obtained from the wafer 2. After grinding, these chips or dies are separated from each other, for example, by cutting the optical device wafer 2 along the division lines 22.

In particular, the optical device wafer 2 may be cut, for example, by using a mechanical cutting means, such as a blade or a saw, by laser cutting, by plasma cutting, e.g., using a plasma source, etc. Further, also a combination of these approaches may be used.

In the following, two further embodiments of the present invention will be described with reference to FIGS. 5A-5B.

Figure 5A:
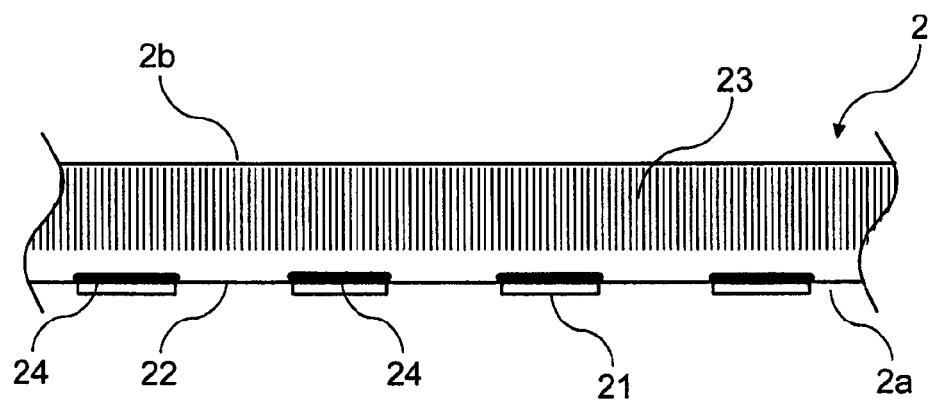
FIG. 5A is a cross-sectional view showing the wafer with the hole regions formed therein for one further embodiment.
Figure 5B:
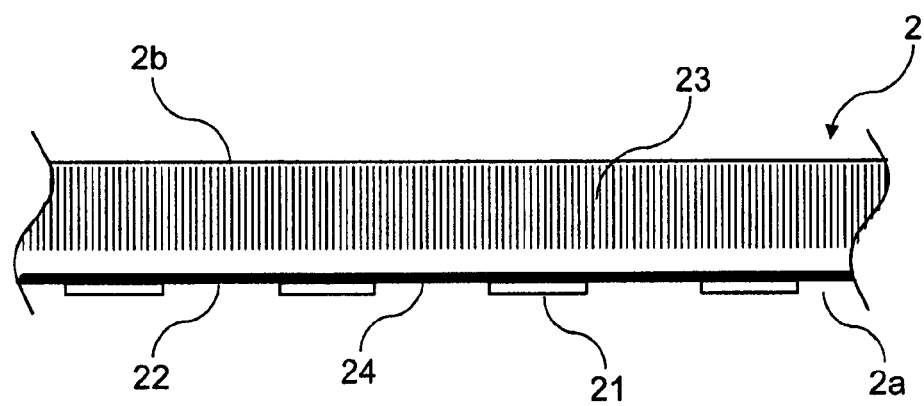
FIG. 5B is a cross-sectional view showing the wafer with the hole regions formed therein for another further embodiment.

The embodiments shown in FIGS. 5A-5B substantially differ from the embodiment detailed above with reference to FIGS. 2A-4C in that at least one beam blocking layer is present on the front side 2a of the optical device wafer 2.

In particular, in the embodiment shown in FIG. 5A, a plurality of separate beam blocking layers 24 are present on the front side 2a, wherein each beam blocking layer 24 is arranged below a respective device 21 in the direction from the front side 2a towards the back side 2b. The beam blocking layers 24 are opaque to the pulsed laser beam (LB).

The embodiment shown in FIG. 5B substantially differs from the embodiment shown in FIG. 5A in that a single beam blocking layer 24 is present on the front side 2a of the optical device wafer 2. This single beam blocking layer 24 is arranged below the devices 21 in the direction from the front side 2a towards the back side 2b and extends over the entire device area 20 (see FIG. 1).

By providing one or more of such beam blocking layers 24 on the front side 2a of the optical device wafer 2, it can be ensured that any damage to the devices 21 formed in the device area 20 by the pulsed laser beam LB applied from the back side 2b is reliably avoided.

The beam blocking layers 24 shown in FIGS. 5A and 5B may be configured to block the pulsed laser beam LB, for example, by absorbing or reflecting the pulsed laser beam LB.

For example, the beam blocking layers 24 shown in FIGS. 5A and 5B may be metal layers or high reflection coatings, such as metal high reflection coatings or dielectric multi-layer high reflection coatings.

In the following, another embodiment of the present invention will be described with reference to FIG. 6A-6C.

Figure 6A:
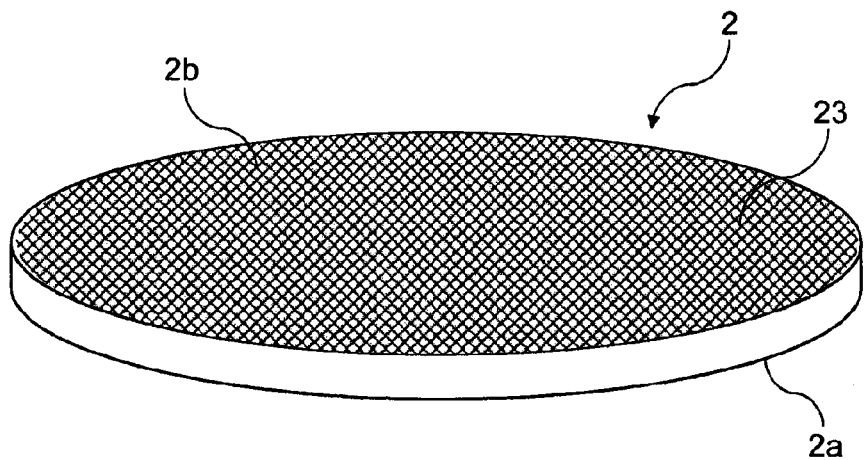
FIG. 6A is a perspective view showing the wafer with the hole regions formed therein, according to yet another embodiment.
Figure 6B:
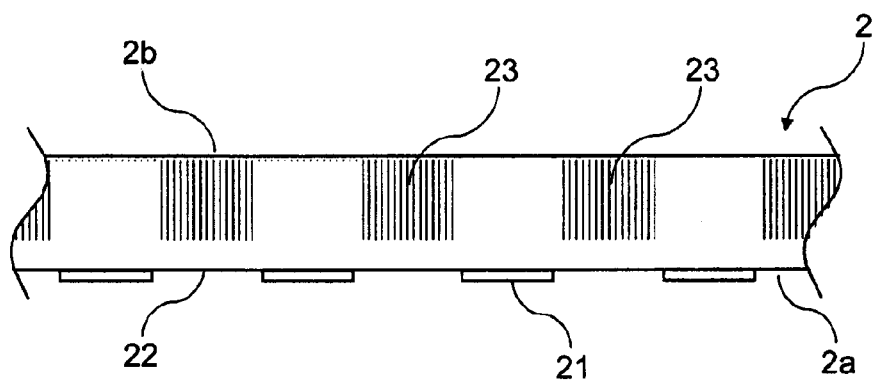
FIG. 6B is a cross-sectional view showing the wafer with the hole regions formed therein.
Figure 6C:
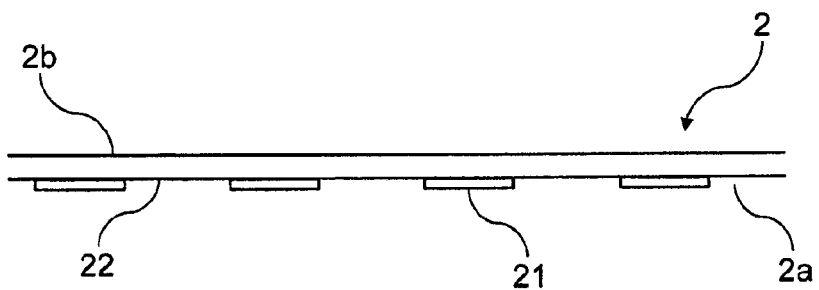
FIG. 6C is a cross-sectional view showing the wafer after the grinding step.

The embodiment shown in FIG. 6A-6C substantially differs from the embodiment detailed above with reference to FIGS. 2A-4C in that the hole regions 23 are formed only in areas of the back side 2b which are opposite the division lines 22, as is shown in FIG. 6B.

According to the embodiment shown in FIG. 6A-6C, the hole regions 23 may be formed in the following manner.

In the alignment step, in the condition where the chuck table 41 is positioned directly below the imaging means, an alignment operation is performed by the imaging means and the control means in order to detect a subject area of the optical device wafer 2 to be laser processed, namely an area of the back side 2b which is opposite a first division line 22. In particular, this alignment operation can be carried out using the infrared light applying means, the optical system and the infrared imaging device, such as an infrared CCD, of the imaging means.

Subsequently, the hole region forming step detailed above is performed along the area of the back side 2b which is opposite the first division line 22 a plurality of times, while slightly shifting the optical device wafer 2 relative to the laser beam applying means in the indexing direction orthogonal to the feeding direction X1 (see FIG. 2A), so as to apply the pulsed laser beam LB also in a plurality of positions on the back side 2b which are arranged along the width direction of the division line 22. In this way, a plurality of hole regions 23 is formed in the area of the back side 2b which is opposite the first division line 22, along the extension direction and the width direction of the division line 22 (see FIGS. 6A and B). The hole regions 23 may be arranged with identical or different distances between adjacent hole regions 23 in the extension direction and/or the width direction of the division line 22.

After performing the hole region forming step a plurality of times along the area of the back side 2b which is opposite the first division line 22 as detailed above, the chuck table 41 is moved in the indexing direction by the pitch of the division lines 22 extending in a first direction on the optical device wafer 2 (indexing step). Subsequently, the hole region forming step is performed a plurality of times in the same manner as described above along the next division line 22 extending in the first direction, i.e., in the extension direction of the first division line 22. In this way, the hole region forming step is performed a plurality of times along all of the areas of the back side 2b which are opposite the division lines 22 extending in the first direction. Thereafter, the chuck table 41 is rotated by 90°, in order to perform the hole region forming step a plurality of times in the same manner as detailed above along all of the areas of the back side 2b which are opposite the other division lines 22 extending in a second direction orthogonal to the first direction.

By forming the hole regions 23 only in the areas of the back side 2b which are opposite the division lines 22, it can be reliably ensured that the devices 21 formed in the device area 20 are not damaged by the pulsed laser beam LB applied to the optical device wafer 2 from the back side 2b thereof.

After performing the hole region forming step in the manner detailed above, a step of grinding the back side 2b of the optical device wafer 2 is carried out in the same manner as described above for the embodiment shown in FIGS. 2A-4C. The outcome of this grinding step is shown in FIG. 6C.

Specifically, the back side 2b is ground along the entire extension, in the direction from the back side 2b towards the front side 2a, of the hole regions 23. Hence, the portion of the optical device wafer 2 in which the hole regions 23 were formed is fully removed in the grinding step, as is shown in FIG. 6C.

The step of grinding the back side 2b of the optical device wafer 2 may be carried out using a grinding apparatus, as will be described in detail further below with reference to FIG. 8.

The optical device wafer 2 shown in FIG. 6C has been ground to the desired thickness of the chips or dies to be obtained from the wafer 2. After grinding, these chips or dies are separated from each other, for example, by cutting the optical device wafer 2 along the division lines 22 in the same manner as described above for the embodiment shown in FIGS. 2A-4C.

In the following, another embodiment of the present invention will be described with reference to FIGS. 7A-7B.

Figure 7A:
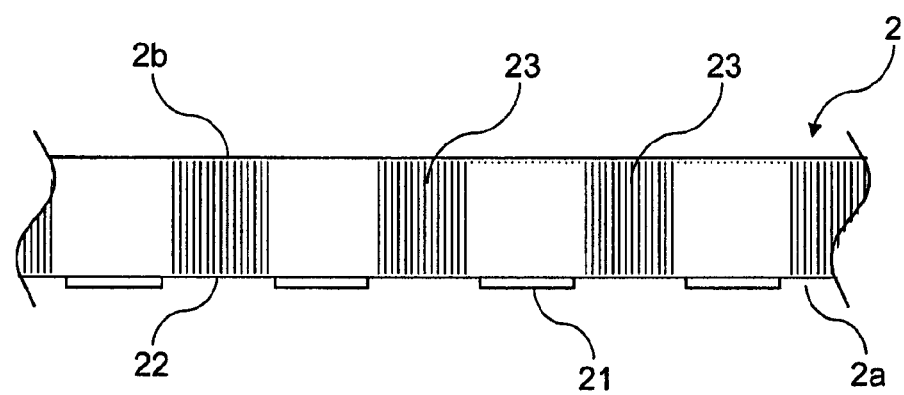
FIG. 7A is a cross-sectional view showing the wafer with the hole regions formed therein, according to yet another embodiment of the present invention.
Figure 7B:
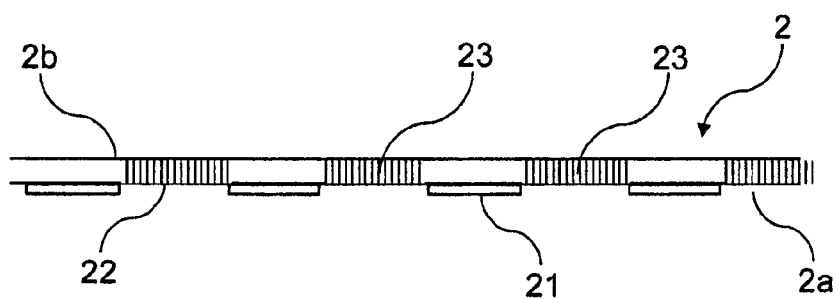
FIG. 7B is a cross-sectional view showing the wafer after the grinding step.

The embodiment shown in FIGS. 7A-7B substantially differs from the embodiment detailed above with reference to FIGS. 6A-6C in that the hole regions 23 are formed so as to extend along the entire thickness of the optical device wafer 2, as is shown in FIG. 7A.

In the step of grinding the back side 2b of the optical device wafer 2, the back side 2b is ground along only a part of the extension, in the direction from the back side 2b towards the front side 2a, of the hole regions 23. Hence, parts of the portion of the optical device wafer 2 in which the hole regions 23 were formed remain at the positions of the division lines 22 after the grinding step, as is shown in FIG. 7B.

The step of grinding the back side 2b of the optical device wafer 2 may be carried out using a grinding apparatus, as will be described in detail further below with reference to FIG. 8.

Since parts of the portion of the optical device wafer 2 in which the hole regions 23 were formed remain at the positions of the division lines 22 after the grinding step, for example, mechanical cutting of the wafer 2 along the division lines 22 can be performed in a more efficient manner, in particular, with an increased processing speed. For instance, for the case of a blade or saw dicing process, the blade or saw dicing speed can be significantly increased.

If hole regions 23 remain on the separated parts of the optical device wafer 2 after the cutting process, they can be subsequently removed, e.g., by polishing or etching the outer or side surfaces of the resulting substrate parts, e.g., chips or dies.

Figure 8:
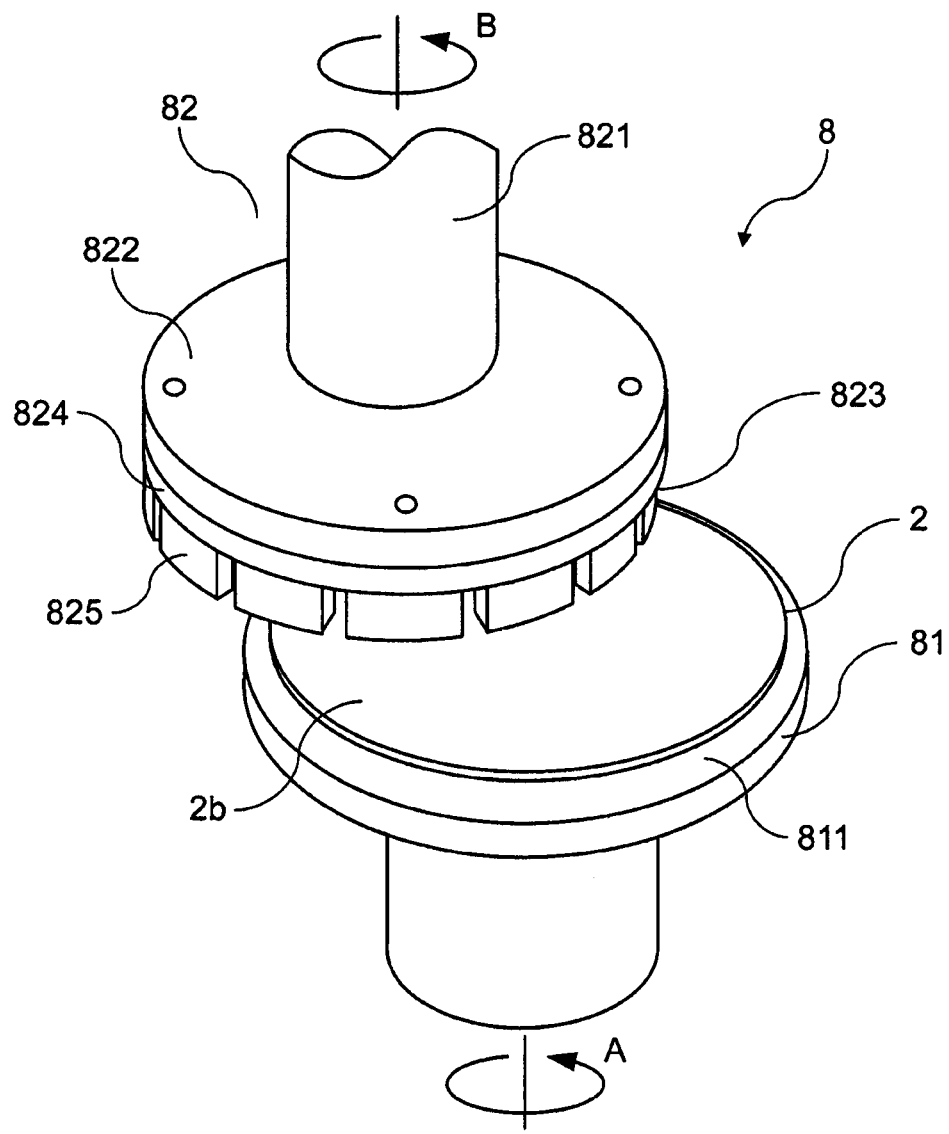
FIG. 8 is a perspective view showing a grinding apparatus for performing a grinding step according to the processing methods of the present invention.

FIG. 8 is a perspective view showing a grinding apparatus 8 for performing a grinding step according to an embodiment of the processing method of the present invention. In particular, the grinding apparatus 8 may be used for carrying out the grinding steps in the embodiments shown in FIGS. 2A-7B.

As is shown in FIG. 8, the grinding apparatus 8 includes a chuck table 81 for holding a workpiece and a grinding means 82 for grinding the workpiece held on the chuck table 81. The chuck table 81 has an upper surface 811 as a holding surface for holding the workpiece thereon under suction. The grinding means 82 includes a spindle housing (not shown), a rotating spindle 821 rotatably supported to the spindle housing and adapted to be rotated by a driving mechanism (not shown), a mounter 822 fixed to the lower end of the rotating spindle 821 and a grinding wheel 823 mounted on the lower surface of the mounter 822. The grinding wheel 823 comprises a circular base 824 and abrasive elements 825 mounted on the lower surface of the circular base 824.

Grinding of the back side 2b of the optical device wafer 2 is performed by holding the wafer 2 on the chuck table 81 of the grinding apparatus 8 so that the front side 2a of the wafer 2 is in contact with the upper surface 811 of the chuck table 81. Hence, the back side 2b of the wafer 2 is oriented upwards, as is shown in FIG. 8. Subsequently, the chuck table 81 with the optical device wafer 2 held thereon is rotated around an axis perpendicular to the plane of the optical device wafer 2, i.e., in the rotational direction indicated by an arrow A in FIG. 8, and the grinding wheel 823 is rotated around an axis perpendicular to the plane of the circular base 824, i.e., in the rotational direction indicated by an arrow B in FIG. 8.

While rotating the chuck table 81 and the grinding wheel 823 in this manner, the abrasive elements 825 of the grinding wheel 823 are brought into contact with the back side 2b of the wafer 2, thus grinding the back side 2b.

The methods according to the embodiments of the invention described above may further comprise polishing and/or etching the back side 2b of the optical device wafer 2 after grinding. In this way, any stress generated in the optical device wafer 2 during grinding can be relieved. For instance, a dry polishing step, a wet polishing step, a chemical mechanical polishing (CMP) step, a lapping step, a dry etching step, such as a plasma etching step, and/or a wet etching step may be carried out after the grinding step.

Although, in the preferred embodiments detailed above, methods of processing a single crystal substrate, i.e., the optical device wafer 2, were given as examples, the processing method of the present invention may be applied to other types of substrates, such as glass substrates, compound substrates or polycrystalline substrates, in the same manner.

The invention claimed is:

1. A method of processing a substrate, having a first surface with a device area and a second surface opposite the first surface, wherein the device area has a plurality of devices formed therein, the method comprising:
applying a pulsed laser beam to the substrate from the side of the second surface, in a plurality of positions along the second surface, so as to form a plurality of hole regions in the substrate, each hole region extending from the second surface towards the first surface, wherein each hole region is composed of a modified region and a space in the modified region open to the second surface; and
grinding the second surface of the substrate, where the plurality of hole regions has been formed, to adjust the substrate thickness.

2. The method according to claim 1, wherein the pulsed laser beam is applied to the substrate in a condition where a focal point of the pulsed laser beam is located on the second surface or at a distance from the second surface in the direction from the second surface towards the first surface.

3. The method according to claim 1, wherein the pulsed laser beam is applied to the substrate in a condition where a focal point of the pulsed laser beam is located on the second surface or at a distance from the second surface in the direction opposite to the direction from the second surface towards the first surface.

4. The method according claim 1, wherein the substrate is a single crystal substrate or a glass substrate or a compound substrate or a polycrystalline substrate.

5. The method according to claim 1, wherein the modified region is an amorphous region or a region in which cracks are formed.

6. The method according to claim 1, wherein the hole regions are formed so as to extend along only a part of the thickness, in the direction from the second surface towards the first surface, of the substrate.

7. The method according to claim 1, wherein the second surface is ground along the entire extension, in the direction from the second surface towards the first surface, of the hole regions.

8. The method according to claim 1, wherein the hole regions are formed over the entire second surface.

9. The method according to any one of claim 1, wherein
a plurality of division lines is present on the first surface, the division lines partitioning the plurality of devices, and
the hole regions are formed only in areas of the second surface which are substantially opposite the division lines.

10. The method according to claim 1, wherein
at least one beam blocking layer is present on the first surface,
the at least one beam blocking layer is arranged below the devices in the direction from the first surface towards the second surface, and the at least one beam blocking layer is opaque to the pulsed laser beam.

11. The method according to claim 10, wherein the at least one beam blocking layer extends at least over the entire device area.

12. The method according to claim 10, wherein
a plurality of separate beam blocking layers is present on the first surface, and
each beam blocking layer is arranged below a respective device in the direction from the first surface towards the second surface.

13. The method according to claim 1, further comprising polishing and/or etching the second surface after grinding the second surface.

14. The method according to claim 1, wherein the substrate is made of a material which is transparent to the pulsed laser beam.

* * * * *